United States Patent [19]

Jain

[11] Patent Number: 5,285,236
[45] Date of Patent: Feb. 8, 1994

[54] LARGE-AREA, HIGH-THROUGHPUT, HIGH-RESOLUTION PROJECTION IMAGING SYSTEM

[76] Inventor: Kanti Jain, 18 Algonquian Trail, Briarcliff Manor, N.Y. 10510

[21] Appl. No.: 954,662

[22] Filed: Sep. 30, 1992

[51] Int. Cl.[5] .............................................. G03B 27/53
[52] U.S. Cl. .......................................... 355/53; 355/67
[58] Field of Search ................................ 355/53, 66, 67

[56] References Cited

U.S. PATENT DOCUMENTS

| | | | |
|---|---|---|---|
| 4,891,663 | 1/1990 | Hirose | 355/53 |
| 4,924,257 | 5/1990 | Jain | 355/53 |
| 5,168,306 | 12/1992 | Morimoto et al. | 355/53 |
| 5,227,838 | 7/1993 | Nakanishi et al. | 355/53 |
| 5,227,839 | 7/1993 | Allen | 355/53 |

*Primary Examiner*—Michael L. Gellner
*Assistant Examiner*—D. P. Malley

[57] ABSTRACT

This projection imaging system has large-area exposure capability, high exposure throughput, and high resolution, and comprises: (a) a stage for holding in fixed juxtaposition a mask and a substrate, and capable of scanning in one dimension, and when not scanning in that dimension, capable of moving laterally in a direction perpendicular to the scan direction so as to position itself for another scan, the stage exposing the full substrate by breaking up the substrate area into parallel strips, and exposing each strip by scanning the length of the strip across a fixed illumination region; (b) an illumination system having an effective source plane of a predetermined shape, and capable of illuminating on the mask a region of the above predetermined shape; (c) a projection assembly having an object-to-image magnification ratio of unity, having means to render the image in the same orientation as the object, and having an image field of the above predetermined shape and of an area smaller than the substrate area; and (d) provision for additive illumination in overlap regions of areas exposed by adjacent scans such that the effect of the exposure dose delivered in the overlap regions is seamless and the effect of the exposure dose delivered across the entire substrate is uniform.

28 Claims, 5 Drawing Sheets

LARGE-AREA, HIGH-THROUGHPUT, HIGH-RESOLUTION PROJECTION IMAGING SYSTEM

BACKGROUND OF THE INVENTION

1. Field of the Invention

This invention relates to an optical projection imaging system, and more particularly to a system for very high-speed imaging of high-resolution patterns for the production of high-performance electronic products with large areas, such as printed circuit boards, multichip modules, displays and semiconductor integrated circuits.

2. Description of Related Art

Economical manufacturing of many electronic and opto-electronic products requires fabrication of millions of microscopic structures on a single large substrate. The structures can be active devices, such as transistors in a flat-panel display (FPD) of a semiconductor integrated circuit (IC), or passive patterns such as interconnecting conductors in a printed circuit board (PCB) or a multichip module (MCM). The large substrate can be a board, a display panel or a silicon wafer. The pattern sizes in these diverse products range from sub-micron for semiconductor ICs to multi-microns for displays, MCMs and PCBs. The substrate size requirements vary from a few square inches for small modules to a few square feet for large PCBs and displays.

A critical and common factor in the above applications is that they all require a large-area patterning system that can provide the required resolution over the entire substrate. Cost-effective production requirements also prefer systems with high processing throughputs. The patterning technology selected determines not only the ultimate performance of the product, but also the economics of the entire manufacturing process through such key factors as throughput and yield. No patterning system currently exists that meets these criteria satisfactorily. The disclosed invention describes a system technology that delivers all of the desired performance and cost features in a patterning system, namely, large-area capability, high resolution, high throughput, and high yield.

There are three primary types of patterning systems currently in wide use:
contact printing systems,
projection imaging systems, and
focused-beam laser direct writing systems.

Contact printing suffers from two inherent disadvantages: generation of defects during patterning, and mask life degradation. A representative contact printer for volume manufacturing consists of a fixture to align and hold the substrate in contact with the mask, and a collimated high-intensity light source to flash expose the mask pattern onto the substrate. Such systems sometimes feature a two-drawer substrate handling facility, allowing the user to load a second substrate while a first is being exposed; double-sided drawers may allow exposure of opposite substrate sides simultaneously or sequentially. Most contact printers use mercury-xenon or metal-halide lamps, with powers ranging from 2 to 8 kW.

Conventional single-field projection imaging systems eliminate the disadvantages of contact printing resulting from defects and wear, but are limited in the largest substrate size they can expose due to their small image field. Step-and-repeat projection systems overcome this constraint by partitioning the substrate into several segments; however, this decreases throughput and creates the difficult requirement of precisely stitching the segments together. A representative single-field projection system uses a 1:1 magnification lens for imaging the mask pattern onto the substrate, a 1-2 kW mercury-xenon arc lamp, a heat-filtering mirror, and a condenser to direct the radiation to the mask. For different resolution requirements, the maximum image field of the projection lens is different. For example, whereas a 1-mil resolution can be obtained over a 4-inch square field, a 1-micron resolution must be limited to a field diameter of 2-3 cm. Step-and-repeat systems use reduction imaging, typically in the range 2:1-10:1. Generally, systems with larger reduction ratios provide higher resolution, but also lower throughput.

Laser direct writing systems, which write the pattern on the substrate with a focused scanning beam, suffer from an inherently slow speed due to their bit-by-bit, serial mode of addressing. A representative direct writing system uses a focused blue or ultraviolet laser beam in a raster scanning fashion to expose each pixel on the substrate. The focused spot is moved across the substrate in one dimension, while the stage holding the substrate is translated in the orthogonal dimension. Due to serial addressing, the processing times for direct-write systems are long, ranging from a few minutes to a few hours per substrate, depending upon the resolution and complexity of the pattern data.

Thus, existing technologies for microelectronic patterning suffer from major shortcomings, including defect generation on substrate, mask wear, limitation of resolution or field size, and low throughput. Ideally, one desires the throughput of contact printers as well as the high resolution available from projection imaging and direct writing, without any of the disadvantages of the three technologies. There is thus a great need for developing a patterning system for fabrication of electronic products which combines three major performance attributes: high resolution, high processing throughput, and ability to handle large substrate sizes.

An imaging technology which achieves the above objectives has been described by this inventor in his U.S. Pat. No. 4,924,257, Scan and Repeat High Resolution Lithography System, issued May 8, 1990 (application Ser. No. 253,717, filed Oct. 5, 1988). The referenced patent discloses a patterning technology that uses synchronized mask and substrate stages which are moved in such a way that a large number of small image fields are joined together 'seamlessly' without any non-uniformly exposed overlaps or unexposed gaps. This invention discloses a projection imaging system in which the objective of seamless exposure for large-area, high-resolution, high-throughput patterning is achieved using a single, integrated stage assembly for both mask and substrate.

SUMMARY OF THE INVENTION

This invention provides a projection imaging system which can pattern very large microelectronic boards, display panels or semiconductor wafers (for ease of discussion the term 'substrate' will be used) at high production speeds and with high resolution. Light from a lamp or laser source is modified to provide an equal-intensity, regular-hexagon-shaped illumination beam across which the substrate is moved in a scan-and-repeat fashion to achieve uniform, seamless exposure over the entire substrate surface. The hexagonal illumination beam effectively scans the length of the substrate; the width of the substrate is covered by repeating many such scans. Adjacent scans are made to partially overlap—in such a way that in the overlap region the exposures from the two scans are complementary whose sum equals the exposure in the non-overlapping regions, leading to a uniform, seamless exposure of the whole substrate.

The scan-and-repeat seamless exposure mechanism requires that the mask be moved in synchronism with the substrate. Since most projection lenses cause image reversal, the direction of mask movement must be opposite that of the substrate. For high-throughput, cost-effective production it is desireable that the mask and substrate stages move in the same direction, and preferably as a single unit. In the scan-and-repeat projection imaging system described in this invention, the mask and the substrate are held on a single stage, making it possible to feed substrates automatically at a high rate. Image reversal by the projection lens is avoided by re-reversing the image using additional optical means.

It is the object of the invention to provide a projection imaging system which is capable of exposing large substrates uniformly, with high resolution, and with high processing rates.

It is another object of the invention to provide a projection imaging system which is production oriented and in which substrates can be fed automatically.

A feature of the invention is a scan-and-repeat exposure mechanism which produces uniform, seamless exposure of the whole substrate surface by multiple scans which so overlap that exposures from adjacent scans in overlapping regions are complementary.

Another feature of the invention is the provision of a uniform hexagonal illumination beam.

Another feature of the invention is the provision of a single stage assembly for holding both the mask and the substrate in mutually locked positions.

Another feature of the invention is the provision of an integrated, automated substrate feed mechanism.

Still another feature of the invention is the provision of a projection system that includes optical means to produce non-reversing images.

An advantage of the invention is the elegant simplicity of its mechanical and optical systems, resulting in a highly efficient, versatile, and economical patterning system.

Another advantage of the invention is the elimination of the trade-off between high resolution and large field size, which thereby delivers both of these performance features without limitations.

Another advantage of the invention is its high processing throughput.

Another advantage of the invention is its provision for locked mask and substrate movement, enabling high-precision patterning.

Still another advantage of the invention is its provision for easy and fast substrate loading.

Other objects, features and advantages of the invention will be apparent from the following specification and from the annexed drawings and claims.

DETAILED DESCRIPTION OF THE PREFERRED EMBODIMENT

Figure 1:
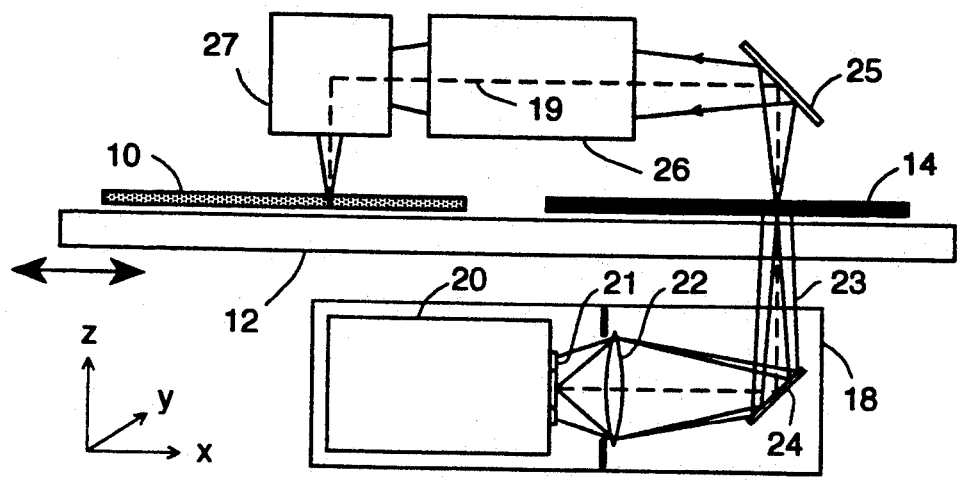
FIG. 1 is a composite illustration of the preferred embodiment of a large-area, high-throughput, high-resolution scan-and-repeat patterning system, showing an illumination system, a stage holding a mask and a substrate, a projection lens assembly, and optical image reversing means. The stage scans longitudinally in the x-direction and moves laterally along y between scans.

FIG. 1 illustrates the preferred embodiment of the new projection imaging system. The substrate 10 and mask 14 are held rigidly on a stage 12. The stage 12 is capable of scanning longitudinally in the x-direction (left-right) and moving laterally in the y-direction (perpendicular to the plane of the paper). The illumination system 18 consists of a source system 20, a relay lens 22, and beam steering optics 24. The source system 20 is such that its effective emission plane 21 is in the shape of a regular hexagon. The relay lens 22 collects radiation from the effective emission plane 21 and directs it on the mask 14. A 1:1 projection lens assembly 26, consisting of several individual lens elements, forms a precise image of the pattern contained within the illuminated hexagonal region on the mask 14 onto the substrate 10. The optical path also includes a folding mirror 25 and optical reversing means 27 consisting of mirrors or prisms. The function of the reversing unit is to undo the image reversal caused by the lens 26. Thus, the combined effect of lens 26 and reverser 27 is to image the illuminated mask pattern, without changing its orientation, onto the substrate.

Figure 2:
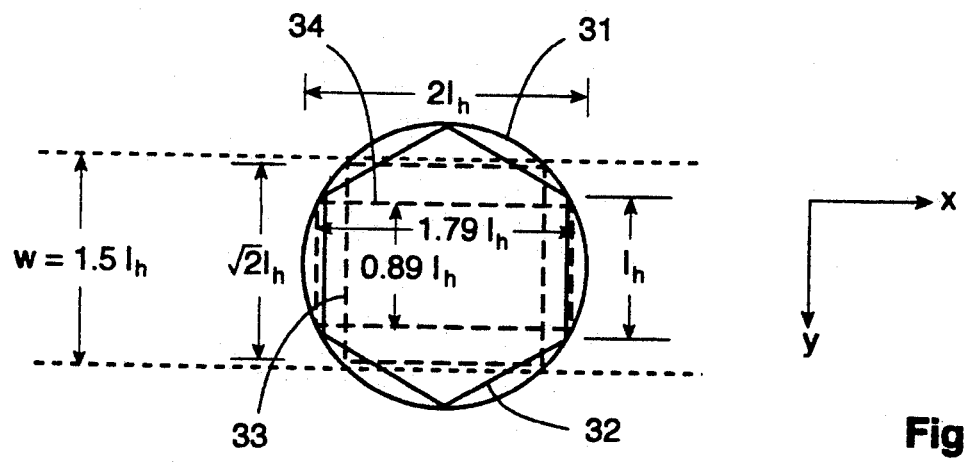
FIG. 2 shows the circular, square and rectangular image fields of the projection lens, the hexagonal cross section of the illumination beam, and the effective scan width w.

The projection lens assembly 26 has a numerical aperture determined by the resolution requirements of the patterning system and is designed for as large a circular image field as possible (shown by 31 in FIG. 2). The illumination region on the mask (and therefore also the exposure region on the substrate) is then defined as the largest regular hexagon (shown by 32 in FIG. 2) that can be inscribed within the above circular field.

Returning to FIG. 1, the stage is scanned in the x-direction so that the length of the mask traverses across its hexagonal illumination region. This results in the substrate being simultaneously scanned across its hexagonal exposure region. After completion of a scan, the stage moves in the y-direction by an amount termed the 'effective scan width' (=w, defined below). Following such a lateral movement, a new x-scan is generated as before, the stage is again moved along y by w, and the process is repeated until the entire substrate is exposed. Note that the illumination beam 23 is stationary, as are the projection lens assembly 26 and the reversing optical means 27.

Figure 3:
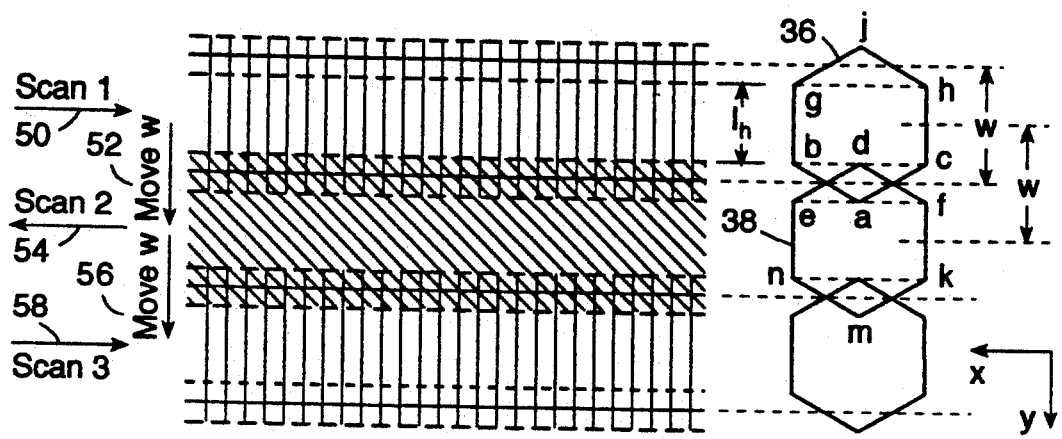
FIG. 3 illustrates the scan-and-repeat mechanism, showing three adjacent scans generated by overlapping hexagonal illumination beams and the complementary exposure in the overlap regions which generate the seamless transitions between adjacent scans. The figure also shows the scan direction alternating between +x and −x, and the lateral movements by w between scans.

FIG. 3 illustrates the details of the mechanism of seamless overlapping hexagon scanning. The regular hexagon 36, also shown as a-b-g-j-h-c, represents the illuminated region on the mask at any time. The first x-scan of the substrate across its hexagonal exposure region is depicted as scan 1, or 50. The orientation of the hexagon 36 is such that one of its sides, for example b-g, is orthogonal to the scan direction. After completion of scan 1, the stage is moved along y by the effective scan width w (52), defined as $$w = 1.5\, l_h,$$

where $l_h$ is the length of each side of the hexagon. This new position of the hexagonal exposure region, relative to the substrate, is 38, also shown as d-e-n-m-k-f. Now scan 2 (54), is generated by scanning the stage in the reverse direction. At the end of scan 2, the substrate is again moved by a distance w (56), the scan direction is again reversed, and scan 3 (58) is generated, and so on. Thus, in this preferred embodiment, the scan direction alternates between right-to-left and left-to-right. In an alternate embodiment, one may have all scans in the same direction; in this case, at the end of each scan the stage is returned to its previous starting position and moved laterally by w before beginning the next scan.

I next describe how the above scan-and-repeat mechanism achieves one of its important features, namely the seamless overlap region between adjacent scans. First let us identify the non-overlapping regions. In scan 1, the region swept by the rectangular portion b-g-h-c of hexagon 36 is not overlapped by any portion of scan 2. Similarly, in scan 2, the region swept by the rectangular portion e-f-k-n of hexagon 38 is not overlapped by any portion of scan 1. However, the region swept by the triangular segment a-b-c of hexagon 36 in scan 1 is re-swept in scan 2 by the triangular segment d-e-f of hexagon 38. By integrating the dose received from each of the above triangular segments at any point on the substrate in the overlapping region, it can be rigorously shown that the cumulative exposure dose received anywhere in the overlapping region is the same as in the non-overlapping regions. Thus, the transition from scan 1 to scan 2 (and therefore the entire substrate) is seamless in exposure dose uniformity because (a) the doses provided by hexagons 36 and 38 taper in opposite directions in the overlapping region, and (b) they taper to zero at apex a and apex d, respectively.

In addition to making it possible to join multiple exposure regions seamlessly, the hexagonal illumination also makes the most efficient utilization of the light source output and the projection lens aperture. For example, referring to FIG. 2, for a lens aperture of diameter $2\, l_h$, the illumination areas with a hexagonal beam, a square beam, and a rectangular beam (of aspect ratio 2:1) will be, respectively, $$A(\text{hexagonal}) = 6 \times (l_h/2) \times (l_h \cos 60°) = 2.6\, l_{h2},$$

$$A(\text{square}) = 2\, l_{h2}, \text{ and}$$

$$A(\text{rectangular}) = 2\, l_h \cos(\tan^{-1} 0.5) \times 2\, l_h \sin(\tan^{-1} 0.5) = 1.79 \times 0.89\, l_{h2} = 1.6\, l_{h2}.$$

Thus, in illumination and lens aperture utilization, a hexagonal beam is 30% more efficient than a square beam and 62.5% more efficient than a rectangular beam of 2:1 aspect ratio.

Figure 4:
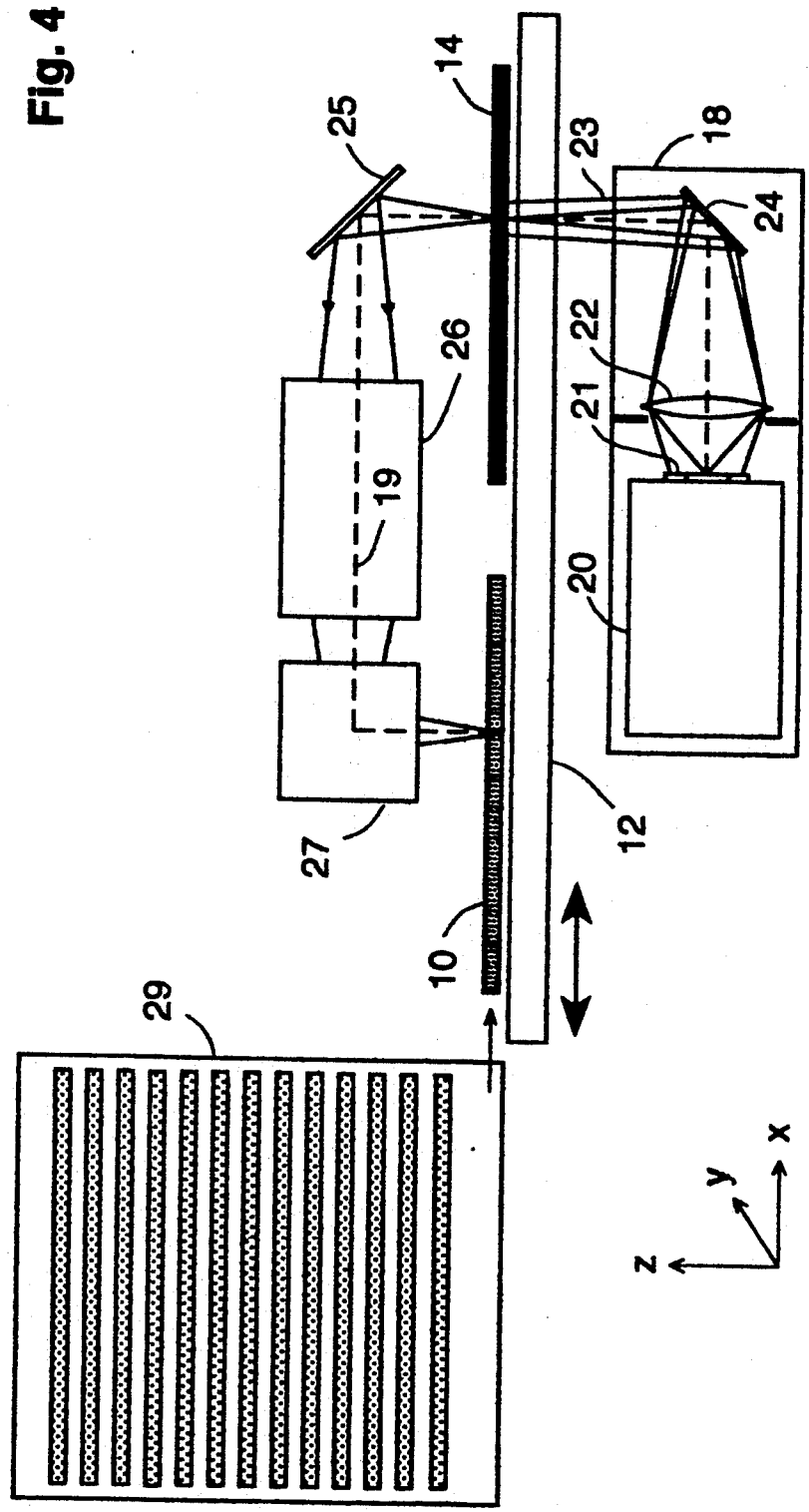
FIG. 4 shows the addition of an automatic substrate feeder to the embodiment of FIG. 1 to facilitate high-throughput production.

From the description of the preferred embodiment thus far, it is clear that the scan-and-repeat patterning technology described in this invention not only makes it possible to obtain high resolution by permitting selection of the desired numerical aperture of the projection lens, but also delivers that high resolution over any substrate with practically no size limitation. Further, the embodiment of FIG. 1 also lends itself attractively for high-throughput production. Since the entire substrate can be patterned once it is mounted on the stage, the substrate and the mask require only one loading step and one alignment step. In addition, for high-volume mass production, the loading of the substrates can be highly automated. FIG. 4 presents an embodiment illustrating the addition of an automatic substrate feeder 29 to the configuration of FIG. 1. Here, after the scan-and-repeat patterning operation is completed on a substrate, it is quickly replaced with a new blank substrate to be patterned.

In the embodiments of FIGS. 1 and 4, the projection lens assembly 26 is preferably an all-refractive system, typically consisting of 4-10 lens elements which are anti-reflection coated for the wavelength(s) of operation. In alternative embodiments, mirror imaging systems, or combination refractive-reflective projection assemblies may be considered. The reversing unit 27 in FIGS. 1 and 4 is preferably an all-mirror assembly. Alternatively, the unit 27 may consist of one or more prisms or a combination of prisms and mirrors.

Figure 5:
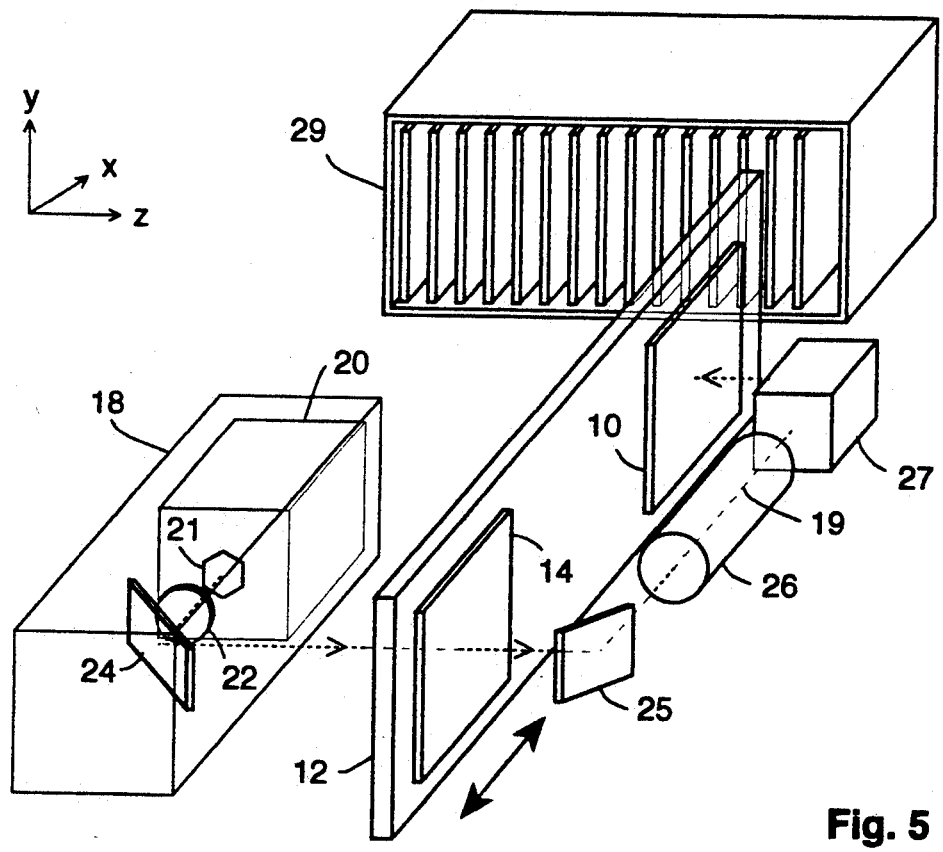
FIG. 5 illustrates a variation of the embodiment of FIG. 4, showing the mask and the substrate mounted vertically on a vertical stage which scans in a horizontal direction.

The stage 12 in FIGS. 1 and 4 is preferably horizontal, as are the mask 14 and the substrate 10, and all their movements. The optical axis 19 of the projection lens assembly 26 is also horizontal. In an alternate embodiment, illustrated in FIG. 5, the stage 12 with the mask 14 and the substrate 10 mounted on it can be vertical. The longitudinal scan of the stage will still be in a horizontal direction, but its lateral movements between two scans will be in a vertical direction. In this alternate embodiment, the optical axis 19 of the projection lens assembly 26 will remain horizontal. In FIG. 5, I have also indicated the illumination system 18, source system 20, its effective hexagonal emission plane 21, relay lens 22, beam steering optics 24, folding mirror 25, reversing optical means 27, and automatic substrate feeder 29.

Figure 6:
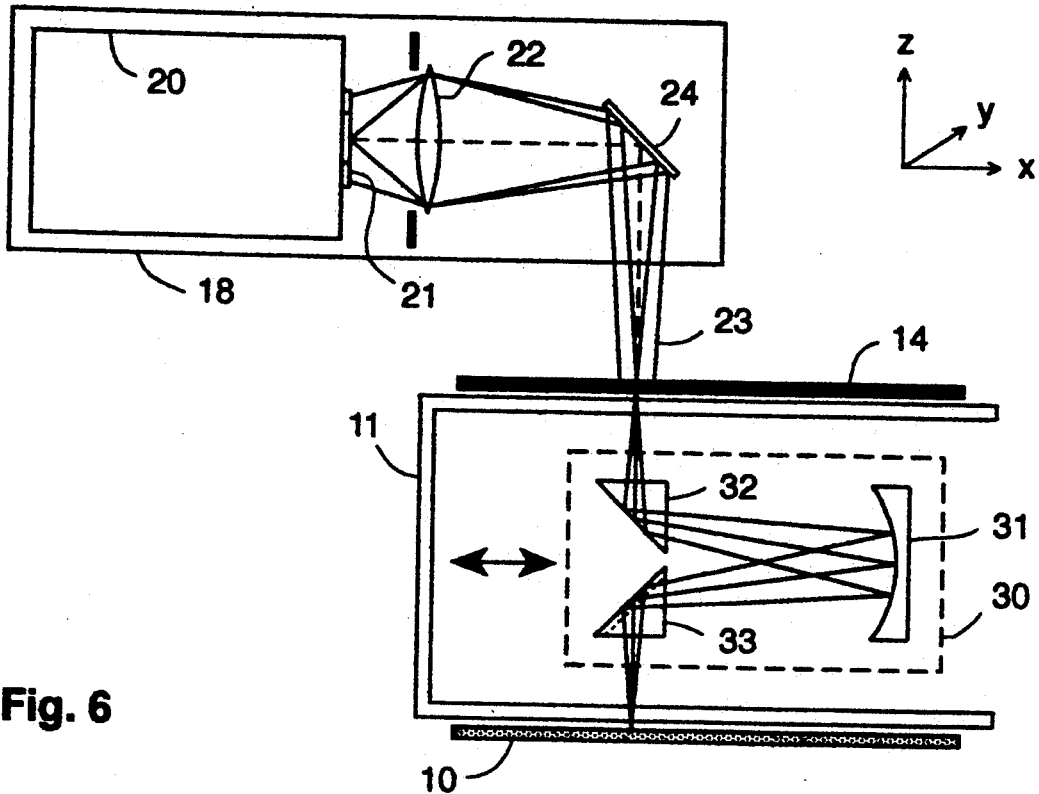
FIG. 6 is a composite illustration of an alternate embodiment of the invention, showing an illumination system, a dual-platform stage, and a projection assembly which comprises a concave mirror as the main imaging element and prisms for folding and image reversal. The patterning of the substrate takes place by scanning either the stage or the projection assembly.

Another embodiment of the invention is illustrated in FIG. 6. Here the mask 14 and the substrate 10 are held on a dual-platform stage 11. The projection system, shown as 30, uses a concave mirror 31 as its primary imaging element and two prisms (32, 33) for beam folding. The illumination system 18 is as before in the embodiments of FIGS. 1, 4 and 5. The prism 32 is a conventional right-angle prism, whereas the prism 33 has additional facets cut in it to produce reflections that re-reverse the image produced by the mirror 31, thereby preventing reversal of the final image produced by the total projection system 30. For exposure, the projection assembly 30, the illumination system 18 and the illumination beam 23 are held stationary, whereas the stage 11 is scanned along x and also stepped along y after each scan. In all of the above embodiments (FIGS. 1, 4, 5) the scanning movement of the stage (11/12) along the x-axis can be effected by a stepping motor such that the total distance scanned is a multiple of a certain quantity $d_s$, where $d_s$ is the minimum distance steppable by the scanning motor. The quantity $d_s$ is thus the scanning resolution of the stage. Further, the scanning of the stage can be electronically linked to the firing of the illumination source pulses. In such a configuration, with each pulse fired by the source, the stage travels one or more units of the distance $d_s$, so that if $v_x$ is the effective stage scanning speed and f the source pulse repetition rate, then $d_s$ is related to $v_x/f$ by an integral ratio.

Figure 7:
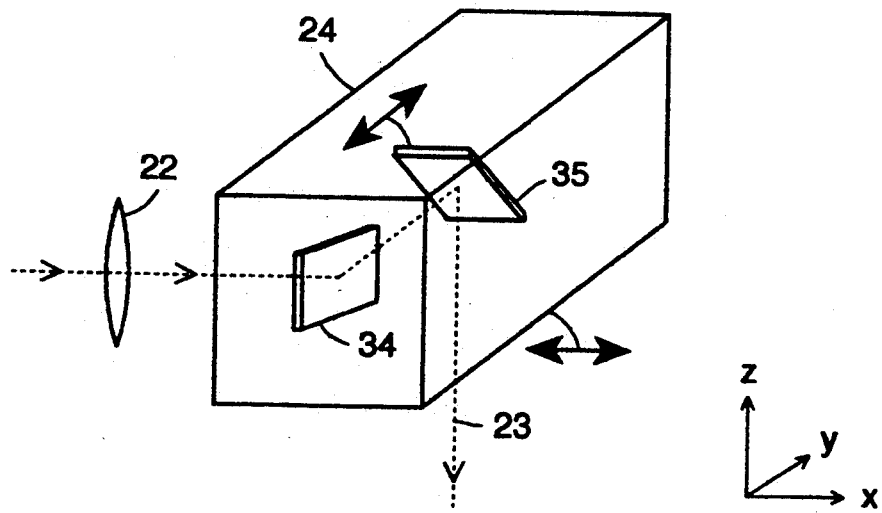
FIG. 7 shows optical means for use in the embodiment of FIG. 6 to move the illumination beam in synchronism with the projection assembly.

In a variation of the embodiment of FIG. 6, the stage 11 may be held stationary, whereas the projection assembly 30, comprising the mirror (31) and the prisms (32, 33), may be scanned between the mask 14 and the substrate 10 and also stepped after each scan. In this embodiment, the illumination beam 23 incident on the mask is moved in synchronism with the projection system 30. This can be done by translating the mirror 24 along the x-axis (or rocking it around the y-axis) to move the beam 23 longitudinally along the scan direction, and rocking the mirror around the x-axis to move the beam laterally (in the y-z plane). Alternatively, as illustrated in FIG. 7, the beam steering optics 24 may consist of two mirrors 34 and 35, in which case translating the two mirrors as a unit in the x-direction moves the beam 23 in the scan direction, and translating the mirror 35 alone in the y-direction moves the beam laterally.

Figure 8:
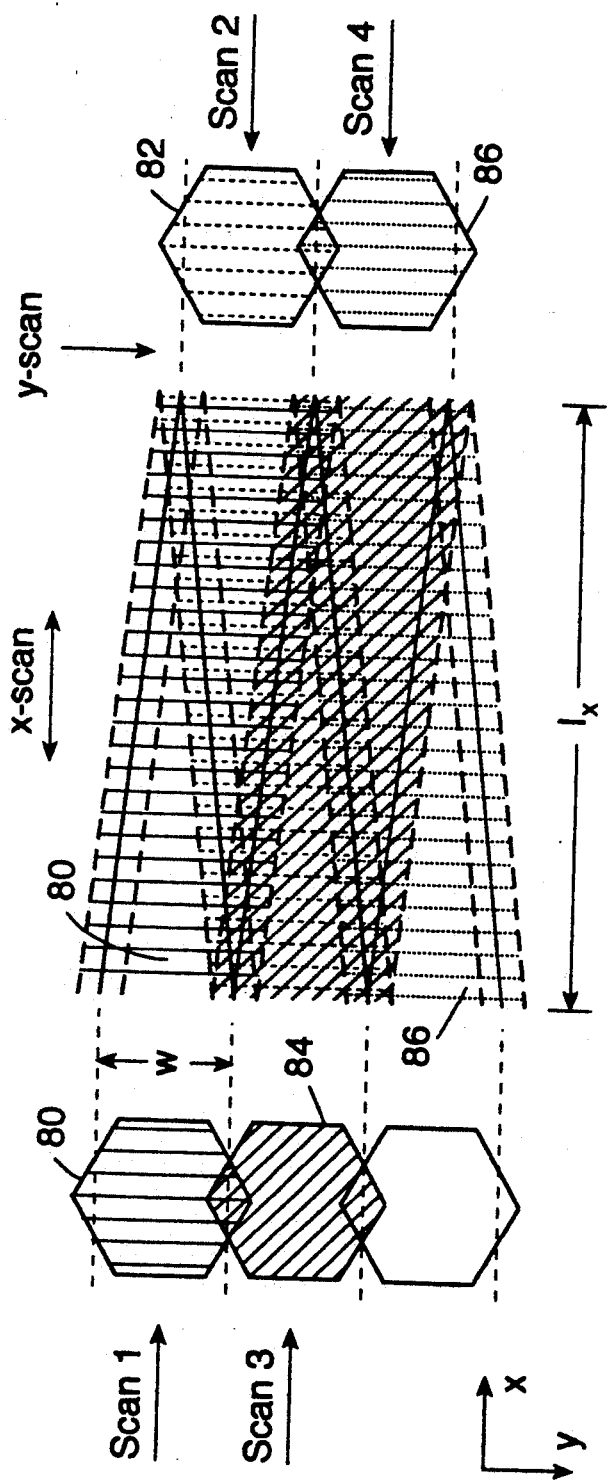
FIG. 8 illustrates the principle of simultaneous two-dimensional scan-and-repeat seamless imaging for large-area patterning.

For all of the embodiments discussed above, we now describe a variation called 'two-dimensional overlapping scanning'. In this embodiment, scanning of the unitary stage (either planar or dual-platform) is carried out simultaneously both in the x- and y-dimensions. Referring to FIG. 8, scanning in the x-dimension begins with scan 1 (80) from left to right, its direction reverses at the end of scan 1, scan 2 (82) is then carried out right to left, scan 3 (84) again left to right, scan 4 (86) right to laft, and so on. As in FIG. 3, the illuminated region on the mask is hexagonal, the effective width of each x-scan is w, and the overlap between scans 1 and 3 (and between 2 and 4) is seamless. Simultaneously with the x-scanning, the stage is scanned continuously in the y-direction. The y-scan rate is such that during the time the stage takes to complete one round-trip x-scan, it moves in the y-direction by w. Thus, if $v_x$ and $v_y$ are, respectively, the x- and y-scan velocities of the stage, $l_x$ the total x-scan length, and $t_x$ and $t_y$, respectively, the time durations to scan the distances $l_x$ and w in the x- and y-directions, then, since $t_x=2t_y$, $v_x$ is related to $v_y$ by $$v_y/v_x=w/2l_x.$$

In any implementation of the disclosed invention, the source 20 in the illumination system 18 is selected to optimally match the exposure requirements of the radiation-sensitive material applied on the substrate 10. For a majority of photoresist materials, a mercury lamp is desirable as the illumination source. In some cases, the radiation source may be a continuous-wave source; in others, it may be pulsed at a certain repetition frequency. For exposure of many materials, especially polymers, laser sources are desirable. A particular class of laser sources useful in imaging is excimer lasers, which are attractive for both wet and dry patterning of resists and polymers. Other laser sources, desirable in applications such as marking, include carbon-dioxide and neodymium lasers. It is also possible to use sources other than those in the ultraviolet, visible and infrared optical spectral regions. Thus, for certain imaging applications, an X-ray illumination source may be desirable. Here, the imaging assembly (26,27) will be an X-ray projection system consisting of suitable X-ray optics; alternatively, the imaging may take the form of shadow printing, in which case a proximity configuration may be used without a projection assembly. Finally, in the same manner as X-rays, one may also use an electron-beam source in proximity configuration in a scan-and-repeat seamless patterning system according to this invention.

METHOD OF OPERATION

The invention describes a method of providing a large-area, high-throughput, high-resolution scan-and-repeat patterning system using the following steps:

1. Providing a stage for holding both a substrate and a mask, and capable of scanning longitudinally in one direction, and also capable of moving laterally in a direction perpendicular to the scan direction;

2. Providing an illumination system which produces radiation of the wavelength and intensity required by the substrate, and which produces on the mask an illumination region in the shape of a regular hexagon of side $l_h$ which can be inscribed within the circular image field of the projection assembly described in step 3 below;

3. Providing a projection imaging assembly of magnification 1:1, which has a circular image field size which may be substantially smaller than the size of the substrate, and which is designed to produce a 1:1 image of the illuminated region of the mask on the substrate with the required resolution;

4. Providing an optical reversing unit which undoes the reversal of the image orientation produced by the projection assembly of step 3;

5. Scanning the stage so that the length of the mask traverses across the hexagonal illumination region described in step 2;

6. Stopping the stage momentarily after completion of a scan across the length of the mask, moving the stage by a distance equal to 1.5 $l_h$ in a direction perpendicular to the scan direction, and resuming the scanning of the stage in a direction opposite to the scan direction in step 5; and 7. Repeating steps 5 and 6 until exposure of the entire substrate is completed.

For additional precision in patterning, the method of operation may further include the step of periodically realigning the mask and substrate with respect to each other during the steps 5–7 above.

EXAMPLE

I now present an example of a patterning system based on the disclosed invention. The application considered here is patterning of photoresist in the fabrication of fine-line printed circuit boards. I use a projection lens assembly with a design resolution of 5 microns and an image field diameter of 100 mm. Referring to FIG. 2, the length of a side of the hexagonal exposure field, $l_h$, is half of the image field diameter. Thus, $$l_h = 50 \text{ mm}.$$

The effective scan width w, as defined previously, is then $$w = 1.5 \, l_h = 75 \text{ mm}.$$

If the scan speed is $v_x$, then the exposure throughput, defined as the area A exposed per unit time, is given by $$A = w v_x.$$

Using $v_x = 250$ mm/sec, I get $$A = 187.5 \text{ cm}^2/\text{sec} = 12.1 \text{ sq. ft/min}.$$

With such an exposure speed, for example, a fine-line printed circuit board of dimensions 24 inches × 36 inches, or a 40-inch diagonal flat-panel display for high-definition television can be exposed in less than half a minute. Thus, the scan-and-repeat patterning system described in this invention is capable of producing very high throughputs as well as delivering very high resolution over very large areas.

I can also readily estimate the source power that will be required to achieve the exposure throughput projected above. Since the area exposed per unit time is $A = w \, v_x$, and if the photosensitivity of the resist used on the board is $D_s$, the required source power incident on the board is given by $$P_i = A D_s,$$

For $D_s = 200$ mJ/cm$^2$ and $A = 187.5$ cm$^2$/sec, I get $$P_i = 38 \text{ W}.$$

Assuming a net energy utilization efficiency (defined as the optical exposure power as a fraction of the input electrical power to the lamp) of 5% for the overall system, it is seen that a 800 W mercury lamp will deliver the required optical output power. Thus, as a result of the scan-and-repeat exposure mechanism, in addition to the benefits already discussed above, the patterning system described in this invention also requires significantly lower source power than prior-art contact and projection printers.

While the invention has been shown preferably through the embodiments illustrated in FIGS. 1-7, it will be clear to those skilled in the art that the modifications described as alternatives, and other alternatives, may be pursued without departing from the spirit and scope of the invention, as defined in the following claims.

What is claimed is:

1. A large-area, high-throughput, high-resolution, scan-and-repeat projection imaging system for replicating patterns present on a mask onto a substrate, characterized by
    (a) a stage subsystem (11/12) comprising mask locking means and substrate locking means providing fixed juxtaposition of the mask (14) relative to the substrate (10); said stage subsystem being capable of scanning in one dimension, and when not scanning in that dimension, capable of moving laterally in a direction perpendicular to the scan direction so as to position itself for another scan; said stage subsystem thus being capable of exposing the full substrate by breaking up the substrate area into a certain number of parallel strips, and exposing each of said strips by scanning the length of the strip across a fixed illumination region;
    (b) an illumination subsystem (18) having the wavelength and intensity distribution characteristics suited for exposure of said substrate (10), having an effective source plane of a predetermined shape, and capable of illuminating on said mask (14) a region of said predetermined shape;
    (c) a projection subsystem (26,27/30) for imaging said illuminated region of said predetermined shape on the mask onto the substrate, having an object-to-image magnification ratio of unity, having the desired imaging resolution, having means (27/33) to render the image in the same orientation as the object, and having an image field of said predetermined shape and of an area smaller than the substrate area; and
    (d) control means to operatively interrelate said stage subsystem (11/12), said illumination subsystem (18) and said projection subsystem (26,27/30) to provide additive illumination in certain overlap regions of areas exposed by adjacent scans such that the effect of the exposure dose delivered in said overlap regions is seamless and the effect of the exposure dose delivered across the entire substrate is uniform.

2. A projection imaging system according to claim 1, further characterized in that
    (a) said illumination subsystem (18) has an effective source plane in the shape of a regular hexagon, and illuminates a regular-hexagon-shaped region on said mask (14), and said regular-hexagon-shaped region on the mask is so oriented that two of its six sides are perpendicular to the scan direction; and
    (b) said projection subsystem (26,27/30) has an image field in the shape of a regular hexagon, and said regular-hexagon-shaped image field is so oriented that two of its six sides are perpendicular to the scan direction.

3. A projection imaging system according to claim 2, further characterized in that the effective width, w, of each scan, as defined by the lateral separation between the center lines of two adjacent scans, is given by $$w = 1.5 \, l_h,$$

where $l_h$ is the length of each side of said regular-hexagon-shaped illuminated region on the substrate.

4. A projection imaging system according to claim 1, further characterized in that said illumination subsystem (18) provides radiation from a mercury lamp.

5. A projection imaging system according to claim 1, further characterized in that said illumination subsystem (18) provides radiation that is pulsed with a certain repetition frequency.

6. A projection imaging system according to claim 5, further characterized in that said pulsed radiation is emitted by an excimer laser.

7. A projection imaging system according to claim 1, further characterized in that said illumination subsystem (18) provides radiation from a carbon-dioxide laser.

8. A projection imaging system according to claim 1, further characterized in that said illumination subsystem (18) provides radiation from a neodymium laser.

9. A scan-and-repeat imaging system according to claim 1, further characterized in that said illumination subsystem (18) provides X-ray illumination of a region of said predetermined shape on said mask (14).

10. A scan-and-repeat imaging system according to claim 1, further characterized in that said illumination subsystem (18) provides electron-beam illumination of a region of said predetermined shape on said mask (14).

11. A projection imaging system according to claim 1, further characterized in that said means (27) to render the final image in the same orientation as the object produces image reversal by reflections from mirrors and prisms.

12. A projection imaging system according to claim 1, further characterized in that said means (33) to render the final image in the same orientation as the object comprises a prism with multiple reflecting surfaces.

13. A projection imaging system according to claim 1, further characterized in that the direction of travel of said stage subsystem (11/12) in any scan is opposite to the direction of its travel in an adjacent scan.

14. A projection imaging system according to claim 1, further characterized in that said stage subsystem (12) comprises a planar stage with a first position for said mask (14) and a second position for said substrate (10), the two positions being aligned in the same plane for imaging by said projection subsystem (26,27).

15. A projection imaging system according to claim 1, further characterized in that said stage subsystem (11) comprises a dual-platform stage with a first position on a first platform for said mask (14) and a second position on a second platform for said substrate (10), the two positions being aligned in parallel planes for imaging by said projection subsystem (30).

16. A projection imaging system according to claim 1, further characterized in that the scanning movement of said stage subsystem (11/12) comprises multiples of a certain unit step movement of length $d_s$.

17. A projection imaging system according to claim 5, further characterized in that the scanning movement of said stage subsystem (11/12) comprises multiples of a certain unit step movement of length $d_s$, which is related by an integral ratio to the quantity $v_x/f$, where $v_x$ is the effective scanning speed of said stage subsystem (11/12) and f is the repetition frequency of the radiation emitted by said illumination subsystem (18).

18. A projection imaging system according to claim 1, further characterized in that said stage subsystem (11/12) is fixed, and relative scanning motion of said illumination region of said predetermined shape on said mask (14) is carried out by movement of said illumination subsystem (18) and said projection subsystem (26,27/30).

19. A projection imaging system according to claim 5, further characterized in that said control means provides for realigning said mask (14) and said substrate (10) with respect to each other periodically, determining the interval between successive realignments by monitoring during said interval the number of pulses emitted by said illumination system (18).

20. A large-area, high-throughput, high-resolution, scan-and-repeat projection imaging system for replicating patterns present on a mask onto a substrate, characterized by (a) a stage subsystem comprising mask locking means and substrate locking means providing fixed juxtaposition of the mask relative to the substrate; said stage subsystem being capable of scanning in a certain dimension x, and simultaneously capable of scanning in a dimension y which is perpendicular to the dimension x, so as to enable said stage subsystem, while it is completing a scan in the x-dimension, to simultaneously move laterally in the y-dimension so as to position itself for another scan in the x-dimension; said stage subsystem thus being capable of exposing the full substrate by breaking up the substrate area into a certain number of parallel strips, and exposing each of said strips by scanning the length of the strip across a fixed illumination region;

(b) an illumination subsystem having the wavelength and intensity distribution characteristics suited for exposure of said substrate, having an effective source plane of a predetermined shape, and capable of illuminating on said mask a region of said predetermined shape;

(c) a projection subsystem for imaging said illuminated region of said predetermined shape on the mask onto the substrate, having an object-to-image magnification ratio of unity, having the desired imaging resolution, having means to render the image in the same orientation as the object, and having an image field of said predetermined shape and of an area smaller than the substrate area; and (d) control means to operatively interrelate said stage subsystem, said illumination subsystem and said projection subsystem, and to provide additive illumination in certain overlap regions of areas exposed by adjacent scans in the x-dimension such that the effect of the exposure dose delivered in said overlap regions is seamless and the effect of the exposure dose delivered across the entire substrate is uniform.

21. A projection imaging system according to claim 20, further characterized in that (a) said illumination subsystem has an effective source plane in the shape of a regular hexagon, and illuminates a regular-hexagon-shaped region on said mask, and said regular-hexagon-shaped region on the mask is so oriented that two of its six sides are perpendicular to the scans in the x-dimension; and (b) said projection subsystem has an image field in the shape of a regular hexagon, and said regular-hexagon-shaped image field is so oriented that two of its six sides are perpendicular to the scans in the x-dimension.

22. A projection imaging system according to claim 21, further characterized in that the effective width, w, of each scan in the x-dimension, as defined by the lateral separation between the center lines of two adjacent scans in the x-dimension is given by $$w = 1.5 \, l_h,$$

wherein $l_h$ is the length of each side of said regular-hexagon-shaped illuminated region on the substrate.

23. The method of providing a large-area, high-throughput, high-resolution, scan-and-repeat projection imaging system, characterized by the following steps:

(a) Providing a stage for holding in fixed juxtaposition a substrate and a mask, and capable of scanning longitudinally in one direction, and also capable of moving laterally in a direction perpendicular to the scan direction;

(b) Providing an illumination system having the wavelength and intensity distribution characteristics suited for exposure of said substrate, having an effective source plane of a predetermined shape, and capable of uniformly illuminating on said mask a region of said predetermined shape;

(c) Providing a projection assembly having an image field of said predetermined shape on said mask which may be smaller than the size of said substrate, and capable of producing a 1:1-magnification image of said illuminated region of said predetermined shape on the mask onto the substrate with the desired resolution;

(d) Providing optical means for undoing the change in the image orientation produced by the projection assembly of step (c) such that the orientation of the final image on said substrate is the same as the orientation of the pattern on said mask;

(e) Scanning the stage of step (a) so that the length of said mask traverses across the illumination region of said predetermined shape described in step (b);

(f) Stopping said stage momentarily after completion of a scan across the length of said mask, moving the stage by a certain distance in a direction perpendicular to the scan direction, and resuming the scanning of the stage in a direction opposite to the scan direction of step (e);

(g) Providing additive illumination in certain overlap regions of areas exposed by adjacent scans such that the effect of the exposure dose delivered in said overlap regions is seamless and the effect of the exposure dose delivered across the entire substrate is uniform; and (h) Repeating steps (e)–(g) until exposure of the entire substrate is completed.

24. The method of providing a projection imaging system according to claim 23, further characterized in that (a) said illumination system has an effective source plane in the shape of a regular hexagon, and is capable of uniformly illuminating a regular-hexagon-shaped region on said mask; and (b) said projection assembly has an image field in the shape of a regular hexagon.

25. The method of providing a projection imaging system according to claim 23, further including the step of aligning said substrate and mask with respect to each other periodically during steps (e)–(h).

26. The method of providing a large-area, high-throughput, high-resolution, scan-and-repeat projection imaging system, characterized by the following steps:

(a) Providing a stage for holding in fixed juxtaposition a substrate and a mask, and capable of scanning simultaneously in certain two dimensions x and y;

(b) Providing an illumination system having the wavelength and intensity distribution characteristics suited for exposure of said substrate, having an effective source plane of a predetermined shape, and capable of uniformly illuminating on said mask a region of said predetermined shape;

(c) Providing a projection assembly having an image field of said predetermined shape which may be smaller than the size of said substrate, and capable of producing a 1:1-magnification image of said illuminated region of said predetermined shape on the mask onto the substrate with the desired resolution;

(d) Providing optical means for undoing the change in the image orientation produced by the projection assembly of step (c) such that the orientation of the final image on said substrate in the same as the orientation of the pattern on said mask;

(e) Scanning the stage of step (a) in the x-dimension so that the length of said mask traverses across the illumination region of said predetermined shape described in step (b), and simultaneously scanning said stage in the y-dimension for a certain distance so as to position itself for another scan in the x-dimension;

(f) Stopping said stage momentarily after completion of an x-dimension scan across the length of said mask, and resuming the x-dimension scanning of the stage in a direction opposite to the x-dimension scan direction in step (e);

(g) Providing additive illumination in certain overlap regions of areas exposed by adjacent x-dimension scans such that the effect of the exposure dose delivered in said overlap regions is seamless and the effect of the exposure dose delivered across the entire substrate is uniform; and (h) Repeating steps (e)–(g) until exposure of the entire substrate is completed.

27. The method of providing a projection imaging system according to claim 26. further characterized in that (a) said illumination system has an effective source plane in the shape of a regular hexagon, and is capable of uniformly illuminating a regular-hexagon-shaped region on said mask; and (b) said projection assembly has an image field in the shape of a regular hexagon.

28. The method of providing a projection imaging system according to claim 26, further including the step of aligning said substrate and mask with respect to each other periodically during steps (e)–(h).

* * * * *